(12) United States Patent
Witzens

(10) Patent No.: US 9,178,520 B2
(45) Date of Patent: Nov. 3, 2015

(54) BROADBAND OPTICAL PHASE DETECTION AND PHASE NOISE REMOVAL WITH AN OPTICAL RESONATOR

(75) Inventor: Jeremy Witzens, Aachen (DE)

(73) Assignee: RWTH AACHEN, Aachen (DE)

( * ) Notice: Subject to any disclaimer, the term of this patent is extended or adjusted under 35 U.S.C. 154(b) by 222 days.

(21) Appl. No.: 13/879,170

(22) PCT Filed: Oct. 13, 2011

(86) PCT No.: PCT/EP2011/067936
§ 371 (c)(1),
(2), (4) Date: Apr. 30, 2013

(87) PCT Pub. No.: WO2012/049272
PCT Pub. Date: Apr. 19, 2012

(65) Prior Publication Data
US 2013/0221211 A1    Aug. 29, 2013

Related U.S. Application Data

(60) Provisional application No. 61/393,170, filed on Oct. 14, 2010, provisional application No. 61/437,673, filed on Jan. 30, 2011, provisional application No. 61/442,179, filed on Feb. 12, 2011.

(51) Int. Cl.
*H03L 7/04* (2006.01)
*H01S 3/00* (2006.01)
(Continued)

(52) U.S. Cl.
CPC ............... *H03L 7/04* (2013.01); *H01S 3/0085* (2013.01); *H04B 10/58* (2013.01); *H04B 10/60* (2013.01); *H01S 3/005* (2013.01)

(58) Field of Classification Search
CPC ............ H03L 7/04; H03L 7/06; H04B 10/58; H04B 10/60; H04B 10/505; H01S 3/005; H01S 3/0078; H01S 3/0085; H01S 3/107; H01S 3/1068; H01S 5/0683; H01S 5/0617; H01S 5/06835; H01S 5/0687; G02F 1/025; G02F 1/225; G02F 1/2255; G02F 1/0356; G02F 1/035; G02F 1/2252; G01N 21/45; H03F 3/08; H03F 3/087; G01D 5/266; G01D 5/35303; G01D 5/35383; G11B 7/126; G02B 27/0087; G01B 9/02; G01J 1/44
USPC ...... 250/227.11, 216, 227.27, 227.19, 214 R; 359/10, 11, 245, 259; 385/1, 2; 372/12, 372/13, 29.014, 29.016
See application file for complete search history.

(56) References Cited

U.S. PATENT DOCUMENTS

| 4,847,477 A * | 7/1989 | Smith ........................ 250/201.9 |
|---|---|---|
| 6,580,532 B1 * | 6/2003 | Yao et al. ........................ 398/39 |
| 2008/0193076 A1 * | 8/2008 | Witzens et al. ................ 385/14 |

FOREIGN PATENT DOCUMENTS

| JP | 62-230073 A | 10/1987 |
|---|---|---|
| WO | WO87/04529 A1 | 7/1987 |

OTHER PUBLICATIONS

Drever, R. W. P., J. L. Hall, F. V. Kowalski, J. Hough, G. M. Ford, A. J. Munley, and H. Ward. "Laser Phase and Frequency Stabilization Using an Optical Resonator." Applied Physics B Photophysics and Laser Chemistry: 97-105. Print.*

(Continued)

*Primary Examiner* — Georgia Y Epps
*Assistant Examiner* — Carolynn A Moore
(74) *Attorney, Agent, or Firm* — McCarter & English, LLP

(57) ABSTRACT

A phase noise detection apparatus comprises a laser beam, an optical resonator coupled thereto at a coupling point and a photodetector receiving light from the laser beam. The laser beam and the resonator coupled thereto convert phase noise of light transported by the laser beam prior to the coupling point into intensity noise of light transported by the laser beam thereafter. Intensity noise is converted into an electrical signal by the photodetector. The electrical signal is sent through a first signal path and a second signal path such that the first signal path transports a signal substantially proportional to the intensity noise, which is integrated in an integrator in the second path. Relative gain of the two signal paths can be adjusted and the overall gain of the signal path is preferably such that the optical phase modulator at least partially cancels said phase noise in the optical domain.

17 Claims, 4 Drawing Sheets

(51) Int. Cl.
*H04B 10/58* (2013.01)
*H04B 10/60* (2013.01)

(56) References Cited

OTHER PUBLICATIONS

Bagheri, M., et al., "Semiconductor laser phase-noise cancellation using an electrical feed-forward scheme", Optics Letters, Oct. 1, 2009, vol. 34, pp. 2979-298.

Eliyahu, D., et al., "Phase noise of a high performance OEO and an ultra low noise floor cross-correlation microwave photonic homodyne system", © 2008 IEEE, pp. 811-814.

Shin, Chul-Ho, et al., "FM Characteristics and Compact Modules for Coherent Semiconductor Lasers Coupled to an External Cavity", Mar. 1990, vol. 2, No. 3, pp. 167-169, IEE Photonics Technology Letters, IEEE Service Center, Piscataway, NJ, US.

Drever, R.W.P., et al., "Laser Phase and Frequency Stabilization Using an Optical Resonator", Applied Physics B. Photo-Physics and Laser Chemistry, Jun. 1983, pp. 97-105, vol. B31, No. 2, Springer Verlag, Heidelberg, Germany.

Armani, D.K., et al., "Ultra-high-Q toroid microcavity on a chip", Nature, Feb. 27, 2003, pp. 925-928, Nature Publishing Group.

Yarviv, Amnon, "Dynamic analysis of the semiconductor laser as a current-controlled oscillator in the optical phased-lock loop: applications", Optics Letters, Sep. 1, 2005, pp. 2191—vol. 30, No. 17, Optical Society of America.

International Search Report for International Application No. PCT/EP2011/067936, mailed Jan. 19, 2012.

* cited by examiner

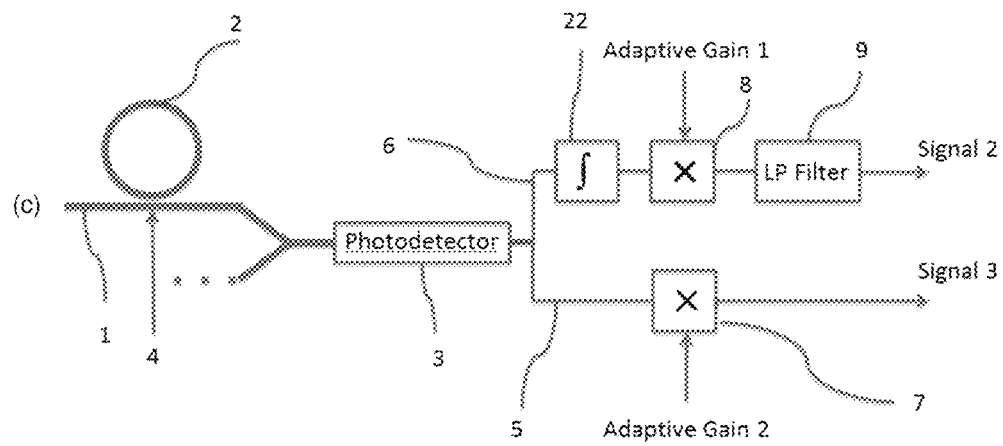
Fig. 2
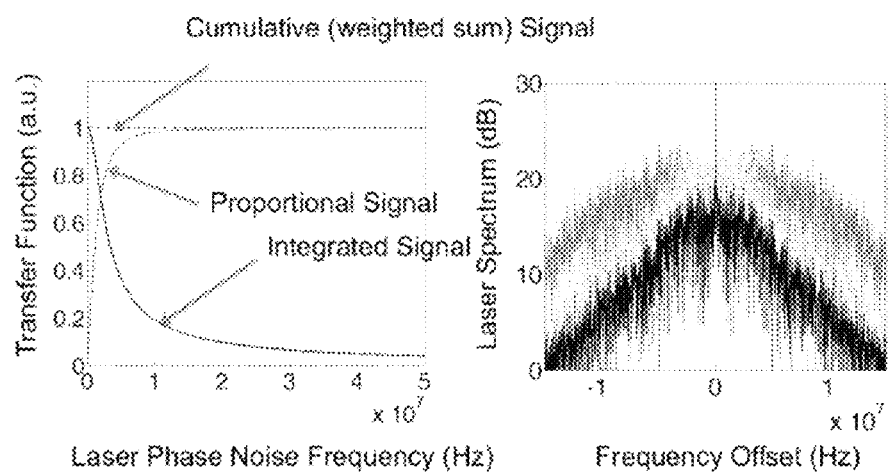

BROADBAND OPTICAL PHASE DETECTION AND PHASE NOISE REMOVAL WITH AN OPTICAL RESONATOR

CROSS-REFERENCE TO RELATED APPLICATIONS

This application is the U.S. National Phase of International Application No. PCT/EP2011/067936, filed Oct. 13, 2011, claiming benefit of U.S. Provisional Patent Application No. 61/393,170, filed Oct. 14, 2010, U.S. Provisional Patent Application No. 61/437,673, filed Jan. 30, 2011, and U.S. Provisional Patent Application No. 61/442,179, filed Feb. 12, 2011, the contents of which are hereby incorporated by reference in their entirety as part of the present disclosure.

FIELD OF THE INVENTION

The present invention relates to a phase noise detection and removal apparatus.

BACKGROUND OF THE INVENTION

Laser phase noise is an important metric that can drive the performance of systems ranging from instrumentation to communication systems. Opto-electronic systems reducing laser phase noise are an ongoing development topic. In particular, achieving the performance of high performance bench top lasers by cleaning up the output of cheap and compact semiconductor lasers is a very important goal. High power semiconductor lasers (above a few tens of mW) tend to have severely degraded linewidth. The linewidth broadening of high power distributed feedback (DFB) lasers is for example typically a result of laser phase noise, so that cleaning laser phase noise could lead to a dramatic improvement of high power semiconductor laser linewidth. Laser phase noise is typically a limiting factor in instrumentation, and can be a limiting factor in long haul communication due to fiber dispersion. With the increasing importance of phase encoding in optical communications, laser phase noise also increasingly becomes problematic in the absence of fiber dispersion since laser phase noise is directly converted into amplitude noise at the receiver optics. Such encoding schemes include binary phase shift keying, differential phase shift keying, quadrature phase shift keying, as well as homodyne or heterodyne (coherent) receivers. On-chip resonators with quality factors (Q-factors) on the order of 100 million have also been demonstrated (see D. K. Armani, T. J. Kippenberg, S. M. Spillane, K. K. Vahala, "Ultra-high-Q toroid microcavity on a chip", Nature 421, 925-928 (2003), hereby incorporated by reference in its entirety.) These allow, for example, on-chip generation of frequency combs (thus also acting as a multi-wavelength light source), or can be used to generate ultra-low noise RF reference signals (see D. Eliyahu, D. Seidel, L. Maleki, "Phase noise of a high performance OEO and an ultra low noise floor cross-correlation microwave photonic homodyne system", Proceedings of Frequency Control Symposium, 2008 I EEE International, Honolulu, Hi. pp. 811-814, 19-21 May 2008. ISBN: 978-1-4244-1794-0 DOI: 10.1109FREQ.2008.4673111, hereby incorporated by reference in its entirety). In order to couple to resonators with such ultra-high quality factors, a light source with correspondingly small line width has also to be used. Since using a bulky and expensive laser defeats the point of using an integrated resonator, the ability to clean up a high power semiconductor laser is particularly powerful in this context.

As a first building block for laser phase noise removal, a laser phase noise detection scheme is required. Typically, an imbalanced interferometer is used, where one of the arms of the interferometer contains a delay line. When the interferometer is properly biased (at the 3 dB point) this results in an output signal whose power corresponds to the derivative of the phase noise, for slowly varying phase noise. Precisely, for a time delay $\tau$ and a time varying phase noise $\phi$, the output power of the interferometer is proportional to $(1+\sin(\phi(t)-\phi(t-\tau)))/2$ which is approximately $(1+\tau \times d\phi/dt)/2$ for a slowly varying phase, $\omega$ denotes the angular frequency of a sinusoidal phase perturbation, i.e. $\phi=\phi_0 \sin(\omega t)$. The output of the imbalanced interferometer is then $\frac{1}{2}+\sin 2\phi_0 \sin(\omega\tau/2)\cos(\phi t-\omega\tau/2))/2$, i.e. the small signal laser phase noise to modulator output power modulation transfer function is given by $\sin(\omega\tau/2)$. This is the conversion gain of the imbalanced interferometer optical phase noise detection scheme. For slowly varying phase noise, increasing the delay line also increases the sensitivity of the noise detection scheme. However there are high frequency zeroes in the transfer function corresponding to $\omega\tau/2=\pi+N\times\pi$, wherein N is an integer. Increasing the delay line also pulls in the high-frequency roll off towards lower frequencies, leading to a sensitivity/optical bandwidth tradeoff. Also, since at low frequencies the interferometer essentially applies a derivative to the phase noise, its output is typically followed by an integrator. This way the transfer function zero at $\omega=0$ is compensated for since the aggregate electro-optic transfer function becomes $\sin(\omega\tau/2)/\omega$.

Phase noise reduction is also described in 3. M. Bagheri, F. Aflatouni, A. Imani, A. Goel, H. Hashemi, "Semiconductor laser phase-noise cancellation using an electrical feed-forward scheme", Opt. Lett. 34, 2979-2981 (2009), hereby incorporated by reference in its entirety.

SUMMARY OF THE INVENTION

Phase Noise Detection Scheme:

Here, a different optical device is used to detect the phase noise: A resonator coupled to a waveguide, a fiber, or a free space beam. While structures are described primarily based on waveguides in this disclosure, it is understood that the invention can also be applied to fiber (a category of waveguides) guided optics, to free space optics or to a combination thereof. Light propagates inside the waveguide to the resonator and fully or partially couples into the resonator. Light from the resonator couples back to the waveguide, and interferes with light in the waveguide (or fiber or free space beam) that did not get coupled into the resonator.

An important distinguishing aspect of this apparatus is that the light transported by the waveguide after the coupling point with the resonator, or light from the free-space optical beam after the coupling point with the resonator, can be directly coupled to a photodetector without further processing and the phase noise of the laser light recorded from said photodetector. Another important distinguishing aspect is that this apparatus works for both phase noise frequencies lying outside the linewidth of the resonator, i.e., for phase noise frequencies such that the corresponding light frequencies resulting from subtracting or adding the phase noise frequency to the center frequency of the light are outside the linewidth of the resonator, and for phase noise frequencies lying inside the linewidth of the resonator, i.e., for phase noise frequencies such that the corresponding light frequencies resulting from subtracting or adding the phase noise frequency to the center frequency of the light are inside the linewidth of the resonator. In the first case, the recorded signal from the photodetector is substantially proportional to the laser phase noise, while in the second case the recorded phase noise is substantially proportional to the derivative of the laser phase noise. By integrating the signal recorded from the photodetector and adding it to the non-integrated signal recorded from the photodetector with a properly chosen relative signal weight, a signal can be generated that is substantially proportional to the laser phase noise for laser phase noise frequencies both inside and outside of the resonator linewidth.

In this invention description optical phase noise is considered to be within the linewidth of the resonator if the frequency of the corresponding optical frequency components generated by the phase noise are within the linewidth of the resonator.

Typical configurations are for example a waveguide coupled to a ring, disk or microtoroid resonator, where light coupled back from the resonator interferes with light that was transmitted through the waveguide without coupling to the resonator. Typically a waveguide can be evanescently coupled to such a resonator, or coupled with other devices such as multi-mode interferometers etc. Another example is a fiber ring coupled to a through fiber via a fiber tap.

Another typical configuration is a Fabry-Perot resonator, where light coupled back out from the resonator interferes with light that was directly reflected back into the waveguide (or fiber) from the input facet of the resonator, without coupling into the resonator. This is a typical configuration when the Fabry-Perot is inscribed into the waveguide or fiber or placed into the optical path of the free space beam. Another possibility is that light coupled back out from the resonator interferes with light that was transmitted through the waveguide (or fiber), without coupling into the resonator. The latter is typically the case for a Fabry-Perot resonator placed to the side of the waveguide or fiber, and that is laterally coupled to via evanescent coupling or via other coupling methods such as a multi-mode interferometer.

The scheme can be implemented with free space optics, i.e. without a waveguide or a fiber, for example by shining a laser beam on the input facet of a Fabry-Perot resonator and monitoring the reflected light (that is the result of interference between the light directly reflected from the input facet and light coupled into the resonator and back out).

It is a well-known fact that a resonator stores optical energy for a time $Q/\omega_{opt}$ where Q is the loaded quality-factor of the resonator (i.e. including coupling losses to the waveguide) and $\omega_{opt}$ is the optical angular center frequency (where the subscript is used to distinguish it from the angular frequency of the phase noise perturbation), and that the time delay of a signal propagating in a resonator loaded waveguide is $2Q/\omega_{opt}$. Thus, the field inside the resonator tracks slowly varying phase noise of the input beam (from the waveguide) with a certain time delay given by $2Q/\omega_{opt}$. Since light coupling back from the resonator to the waveguide interferes with light that was not coupled to the resonator (and that was thus not delayed), the system is essentially equivalent to the imbalanced interferometer in its functionality in the limit of slowly varying phase noise ($\tau$ has simply to be replaced by $2Q/\omega_{opt}$ and the preterm adjusted depending on the coupling strength between waveguide and resonator as well as on the detuning of the laser relative to the center of the resonance, i.e., according to the amount of light coupled into the resonator versus the amount of light not coupled into the resonator).

A typical example is a critically coupled resonator detuned by ½ the full width at half maximum (FWHM) of the resonator linewidth from the laser center frequency. For example, the resonance frequency can be chosen to lie in, and maintained within, plus minus 30% of the FWHM from this frequency.

Another typical example is a waveguide coupled resonator such that the power transmitted through the waveguide from before to after the coupling point lies between 20% and 80%, where 0% is the minimum transmission corresponding to the case where the center frequency of the light is equal to the resonant frequency of the resonator and 100% corresponds to the transmission when the center frequency of the light is detuned from the resonant frequency by two full width at half maximum of the resonant frequency.

The waveguide coupled resonator however differs significantly from the imbalanced interferometer in the limit of quickly varying phase noise (faster than $2Q/\omega_{opt}$). In that limit, the frequency sidebands generated by the phase noise lie outside the linewidth of the resonator. In that case, the resonator does not track the phase noise, but rather provides an averaged out signal reference. Quickly varying phase jumps in the laser beam register directly as amplitude jumps in the interfered output signal of the device. In other words, the device directly provides the phase noise information without applying a derivative to the transfer function. This transfer function also does not have periodic zeroes like the transfer function of the unbalanced modulator, and is thus particularly well suited for broadband detection. For the high-speed noise detection, the electrical integrator can be removed from the signal path, since there is no derivation applied to the phase noise to amplitude noise transfer function of the optical apparatus.

In the intermediate regime, for example with time scales on the order of $2Q/\omega_{opt}/5$ to $5Q/\omega_{opt}$, the output power from the device corresponds to a combination of the phase noise derivative and the direct phase noise detection.

A difficulty in using this device is that when high-speed phase noise detection is targeted, and the power fluctuations are directly taken from the output of the device without further signal processing (e.g. without integration), low speed phase noise is being cut off once it falls within the linewidth of the resonator (i.e. in the absence of an integrator, the phase noise detection gain of slowly varying noise is low). This can be acceptable for applications where low speed phase noise is acceptable or is compensated for by other means (for example by an optical phase locked loop controlling the lase (see A. Yariv, "Dynamic analysis of the semiconductor laser as a current-controlled oscillator in the optical phased-lock loop: applications", Opt. Lett. 30, 2191-2193 (2005) hereby incorporated by reference in its entirety). In this case, it is particularly desirable to use resonators with very high Q factors, since this reduces the resonator linewidth and also reduces the low pass phase noise detection cutoff that is determined by phase noise frequencies falling within the resonator linewidth. For example microtoroids based on thermally reflown dielectrics have been shown to yields Q-factors on the order of 100 million and are an outstanding category of on-chip resonators, particularly if they can be monolithically integrated with other on-chip optics.

For applications where phase noise removal at frequencies lying both inside and outside the linewidth of the resonator is required, the frequency roll-off at low phase noise frequencies can be compensated for in the electrical domain. In particular, the optical output power of the device can be detected by a photodetector. It is subsequently integrated and added to a non-integrated version of the signal. This way, adequate noise detection occurs both inside and outside of the linewidth of the resonator. Moreover, if the relative weights and phases of the integrated and non-integrated versions of the signal are adjusted prior to summation, the resulting aggregate signal reflects the phase noise without distortions depending on whether the signal falls inside or outside the resonator linewidth. Thus a good phase noise monitor is also provided in the intermediate frequency region falling between both regimes.

BRIEF DESCRIPTION OF THE DRAWINGS

FIG. 2 shows a numerical example corresponding to a critically coupled ring resonator. The left graph shows the laser phase noise to electronic signal transfer function. The right graph shows an example of numerical estimation of laser phase noise before and after removal of the laser phase noise based on the detected laser phase noise.

DETAILED DESCRIPTION OF THE INVENTION

In FIGS. 1(a)-1(c) two signals are generated, one corresponding to the integrated optical output power of the waveguide coupled resonator and the other to a proportional, non-integrated signal.

Figure 1:
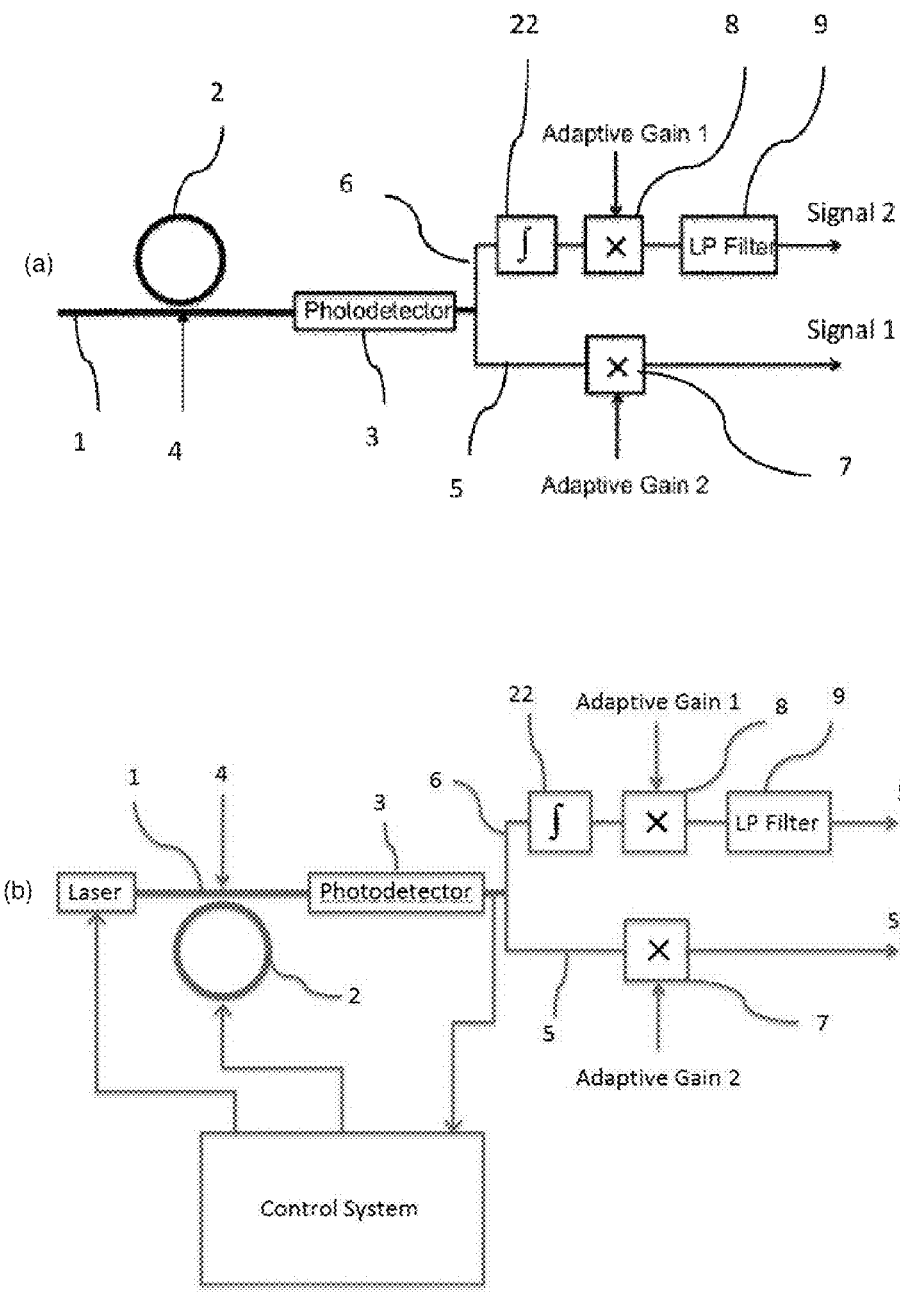
FIG. 1 shows a block diagram of a phase noise detector.

Optionally, the two signals can be independently rescaled, with a gain that can be set by design, adjusted depending on resonator characteristics (for example according to a chip dependent quality factor or a chip dependent resonator to waveguide coupling strength) or dynamically adjusted with a control system, for example to account for laser power variations, slight resonator detuning etc. A control system, shown in the embodiment depicted in FIG. 1(b), is also typically needed to align the laser center frequency with the resonator resonance, either by tuning the laser or the resonator, or both. This relative alignment can be monitored for example by measuring the ratio of the optical power in the system before and after the resonator. The former requires an additional photodetector, while the latter can be measured either with an additional photodetector (for example by tapping some power from the main output waveguide) or it can be monitored by the same photodetector that is also used to record the laser phase noise, that is already drawn in FIG. 1 (in this case, the lowest frequency components can for example be used for laser/resonator control, or the signal can be averaged before being sent to the control system). Since the signal path with the integrator contributes mostly for slowly varying phase noise that lies within the linewidth of the optical resonator, a low pass filter can be optionally added somewhere in that signal path for electronic noise reduction. The adaptive gain elements shown in FIG. 1, or additional elements placed in the signal paths, can also add a relative time delay between the two signal paths with a time delay that can be frequency dependent and that can also be adjusted depending on resonator characteristics (in particular the loaded quality factor of the resonator) or dynamically adjusted with a control system. In particular, the resonator acts as a time delay element for noise components falling within the linewidth of the resonator, so that a time delay can be necessary in the electrical domain to resynchronize the proportional and the integrated signal paths.

The two signals, i.e., the proportional and the integrated signals, can be either applied to different phase modulators (thus summing the two signals in the optical domain), or to the same phase modulator after combination (summation) in the electrical domain. If the relative gain of the two signals is chosen adequately, the laser phase noise to aggregate signal conversion is flatband (frequency independent). This is an important feature for broadband phase removal covering a frequency range both within the resonator linewidth and outside the resonator linewidth. Even in a system where ultra-broadband laser phase noise removal is not required, and where laser phase noise within the linewidth of the resonator is primarily targeted, having both the proportional and the integrated signal paths is advantageous since a flatband laser phase noise detection transfer function is achievable this way throughout the entire resonance linewidth, as opposed to the integrated signal path alone that decays towards the edges of the linewidth. This way, laser phase noise can be equally well removed throughout the entire linewidth of the resonator (and beyond).

For example, it might be desirable to maintain a flatband transfer function (laser phase noise to summed signals) within 1%, 2%, 5%, 10%, 20%, 30% or 40% of the maximum of the transfer function, depending on how stringent the constraints driven by system and by application are. By summing the integrated and the non-integrated signal paths with the proper relative weights, a perfectly flat transfer function can be obtained in principle. For example, a transfer function can be obtained such that the difference between the lowest and the highest value of the transfer function over the entire phase noise frequency range of interest (the transfer function variation) is less than ½, ⅓, ¼, ⅙ or 1/10 of the transfer function variation when only one of the two signal paths is used. When the frequency range of interest covers at least some frequencies within one full width at half maximum of the resonator linewidth, the summation is particularly important to obtain a flatband transfer function (this means there are at least some phase noise frequencies of interest such that they are below 1 FWHM, this does not mean the more restrictive conditions that the phase noise frequencies need to fall within ½ FWHM, since phase noise frequency is described here as a positive number). It becomes crucial when the frequency range of interest covers at least some frequencies between ⅛ of the FWHM to ¾ of the FWHM, since in that frequency range the transfer functions corresponding to either of the signal paths alone both have substantial frequency dependence. For example this is the case when the frequency range of interest covers at least 50% of the frequencies between ⅛ and ¾ of the resonance FWHM.

The effective system gain of the integrated signal path is a function of the time delay introduced by the resonator, which is a function of $Q/\omega_{opt}$, while the proportional signal path is much less sensitive to the quality factor. For this reason, it is desirable for the relative signal gain to be a function of the resonator quality factor. In a manufacturing process where the resonator quality factor has large device-to-device or chip-to-chip variations, an adaptive gain setting might be necessary that is either dynamically set or calibrated on a device-to-device basis. Device specific information on Q-factors, loaded Q-factors or on resonator to waveguide coupling can be used to calibrate devices.

The time delay applied to the phase noise to amplitude noise transfer function for phase noise lying within the linewidth of the resonator is a function of $Q/\omega_{opt}$, while the proportional signal path is much less sensitive to the quality factor. For this reason, it is desirable to adjust the relative time delay as a function of the resonator quality factor. In a manufacturing process where the resonator quality factor has large device-to-device or chip-to-chip variations, an adaptive gain setting might be necessary that is either dynamically set or calibrated on a device-to-device basis. Device specific information on loaded Q-factors, Q-factors or on resonator to waveguide coupling can be used to calibrate devices.

FIG. 2 shows a numerical example corresponding to a critically coupled ring resonator with a loaded quality factor of 50e6 (loaded Q-factor refers to a Q-factor including the losses resulting from coupling to the waveguide or fiber). The left graph shows the laser phase noise to electronic signal transfer function for the proportional, non-integrated signal, the integrated signal and the sum of the two signals with a relative gain chosen to obtain a flat, broadband response. It can be seen that by summing the two signals the Lorentzian characteristic of a resonator can be compensated for. The right graph shows an example of numerical estimate of laser phase noise before correction (top curve), after correction by using the proportional signal only (the lighter middle curve) and by using both signals (the lower, black curve). It can be seen that with the proportional signal alone phase noise is improved for higher phase noise frequencies lying outside the linewidth of the resonator, and that after addition of the integrated signal low speed phase noise is also improved.

The phase noise detection scheme can be implemented with a waveguide coupled to a resonator and routed to a photodetector without the need of additional optics. In particular there is no need to embed the waveguide coupled resonator in an optical superstructure such as a Mach-Zehnder interferometer (in such a structure one of the arms of the Mach-Zehnder Interferometer is for example loaded with a resonator to induce a time delay). In particular, the waveguide can be routed directly from the coupling point with the resonator to the photodetector without the need of additional optical elements on this optical path. For example, there is no need for additional waveguide combiners on this optical path such as in the output coupler of a Mach-Zehnder Interferometer. If additional waveguide combiners are present, as shown in the embodiment of FIG. 1(c), they are likely to have a secondary role and to add a small amount of power to the optical path, for example less than 30% of the power routed from the resonator coupling point to the photodetector.

Phase Noise Cancellation:

Once the phase noise has been detected, by converting it into optical intensity modulation and then, after photodetection, into amplitude modulation of an electrical signal, it can be cancelled by applying this electrical signal to an optical phase modulator placed in the optical path. There are several configurations that can be used, including feed-forward, feedback, or a combination of the two.

Figure 3:
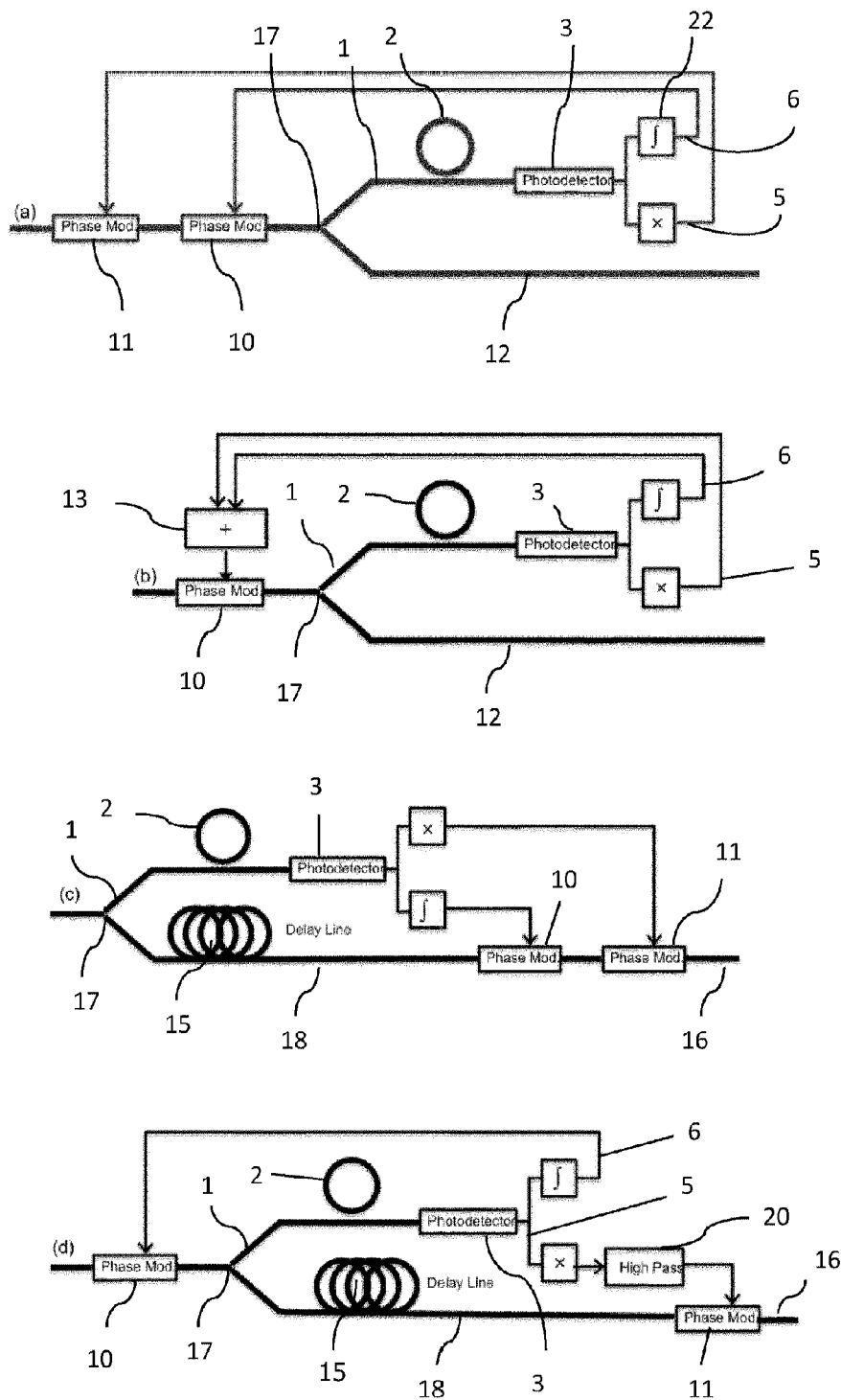
FIG. 3 shows possible configurations: (a) Feedback loop with summation in the optical domain, (b) feedback loop with summation in the electrical domain, (c) Feed-forward scheme with summation in the optical domain and (d) combination of feedback and feed-forward.

In FIG. 3, waveguides are shown with thick lines, and the resonator is represented by a single ring. The X stands for a multiplier or amplifier and the integral sign stands for a signal integrator. In addition, fixed or adjustable time delays can be placed in one of or both of the proportional and integral signal paths. FIG. 3 shows a few possible configurations: (a) Feedback loop with summation in the optical domain, (b) feedback loop with summation in the electrical domain, (c) Feed-forward scheme with summation in the optical domain and (d) combination of feedback and feed-forward. Other permutations are possible, for example a feed-forward scheme with summation in the electrical domain, or different combinations of feedback and feed-forward. One could for example send both the integrated and the proportional signal to the feedback loop (to maintain sufficient gain at the edge or outside of the resonator linewidth and thus increasing the bandwidth of the feedback loop) while also sending at least one of them or a combination of the two forward to compensate for the reduced bandwidth of a feedback scheme. Since the proportional signal carries primarily the high-speed laser phase noise information, it is natural to send at least the proportional signal forward when a feed-forward scheme is present, since feed-forward schemes typically have a higher system bandwidth than feedback loops. Filters can also be added to the signal paths in order to avoid redundant compensation. For example an electrical high-pass filter can be added to the feed-forward path when a feedback path is already present, with a low cutoff matched to the bandwidth of the feedback loop. In order to maximize the bandwidth of the feed-forward scheme, a delay line can be placed in the primary optical path (i.e. the through path that provides the cleaned up laser power to the downstream optical system) as shown in FIG. 3, (c) and (d). This compensates for delays in the phase noise measurement system and in phase modulator driver etc. so that the phase correction is applied to the optical signal corresponding to the same sampling time than the phase noise measurement. Delay lines can be implemented with a variety of methods such as long waveguides, resonators (coupled to the waveguide or to each other), an off-chip fiber, a fiber in a non integrated system etc. For specific applications where only low-speed phase noise, or only high-speed phase noise matter, the integrated signal path alone or the proportional signal path alone might be sufficient.

A flatband transfer characteristic of the aggregate phase noise signal is particularly important when both the integrated and the proportional signals are sent forward. Otherwise, it is very difficult to apply the optimum phase correction over the entire frequency range without undershooting or overshooting at certain frequencies. In a feedback loop, the frequency transfer gain can be more relaxed, since the loop itself compensates for frequency dependent gain variations. However some constraints might remain in order to keep the loop gain high enough for proper phase noise compensation and low enough at high frequencies in order to guaranty loop stability. A calibration step might still be necessary to adjust the gains of one or both of the two signal paths. In this case, in some systems a simple quality factor measurement (for example with a cavity ringdown measurement) might be sufficient to dial in the electronic gain of the integrated signal path.

In an ideal system, the two signal paths are already in phase past the multiplier and integrator. Indeed, the phase delay of the integrator is compensated by the fact that it is applied to a signal corresponding to the derivative of the phase noise. In practice however, the electronic building blocks will introduce non-ideal phase delays that might have to be compensated for prior to summation. This phase delay compensation might have to be made frequency dependent. The derivative applied by the resonator to the phase noise for phase noise frequencies lying within the linewidth of the resonator is also substantially a discrete derivative as given by $(\phi)(\tau)-\phi(t-\tau))$ where $\tau$ is the time delay applied by the resonator, approximating a continuous derivative of a signal delayed by $\tau/2$. This time delay impacts the integrated signal path and might have to be compensated for in the proportional signal path for optimum results.

A precise method to equalize (level) the gain of the two signal paths can consist in comparing the signal levels of the two signal paths to each other in a frequency range where the equalized ratio of the two signal levels is known. The ideal equalized signal ratio depends only on the frequency of the recorded phase noise and on the loaded quality factor of the resonator (specifically, the ratio of the phase noise frequency to the linewidth of the resonator). Thus it is for example possible to electrically tap both signal paths and to apply a notch filter to both taps, with a center frequency chosen such that the corresponding transfer functions for both signal paths is large enough to reliably record a signal, i.e. it should not be extremely high or extremely low relative to the resonator linewidth, a center frequency on the order of half the resonator full width at half maximum is for example a good number. In other words the center frequency should be in the frequency transition region described earlier where both signal paths matter, for example within $2Q/\omega_{opt}/5$ to $5Q/\phi_{opt}$. The bandwidth of the notch filter can be chosen large enough such that phase noise signals are reliably recorded in the bandwidth, even though phase noise is a stochastic phenomena, but thin enough such that the equalized ratio of signals integrated over the bandwidth of the notch filter is well defined (i.e., the target ratio is well defined). The relative gain of the two signal paths is adjusted until the ratio of the two tapped, and optionally filtered signals corresponds to the targeted value.

Figure 4:
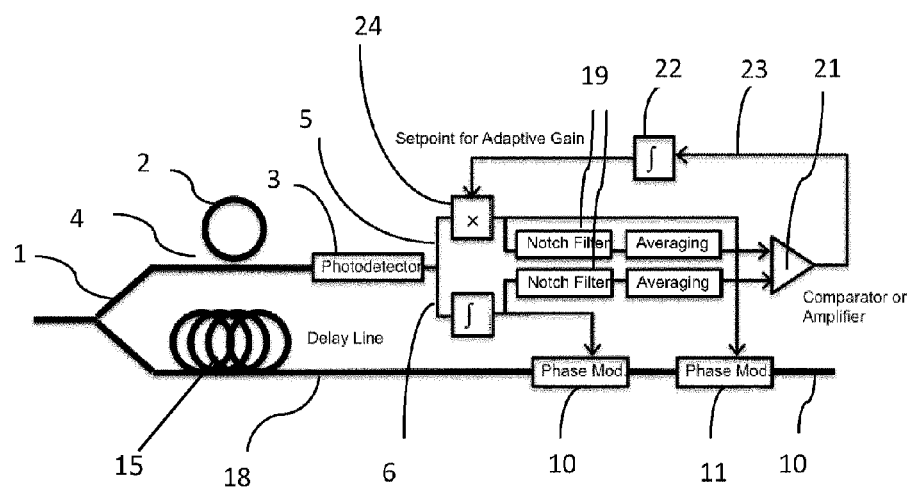
FIG. 4 shows a configuration allowing for equalizing the gain of the two signal paths.

FIG. 4 shows one such system, with optional features such as the averaging or the integrator in the feedback control loop for the adaptive gain set point. The adaptive gain can also be applied to an adaptive amplifier in the integrated signal path, rather then the proportional signal path. The latter might be beneficial since the proportional signal path does not depend on the resonator quality factor and might be more reproducible. For best noise cancellation in a feedforward scheme the overall phase noise gain should also be tightly controlled. An adaptive loop for the overall signal gain could also be provided (for example by setting the gain on adaptive amplifiers in both signal paths, or by summing the two signals in the electrical domain and tuning the gain of an amplifier placed after the summation). In order to provide a feedback signal for the adaptive gain of the overall signal phase noise can be monitored by a second phase noise detection subsystem downstream from the phase modulators. Another option is to tightly control the resonator to waveguide/fiber coupling strength, the laser to resonator resonance detuning as well as laser power levels, so that the signal gains of at least the proportional signal path are known a-priori.

Another method of calibrating the relative gain and/or the relative time delay of the integrated and non-integrated signal paths consists in artificially applying a well known phase noise to the laser light, such as a sinusoidal phase noise, and to compare the signal strengths and/or signal phases of the integrated and non-integrated signal paths. This measurement can for example be repeated for several frequencies or for a range of frequencies and the data set used to calibrate the relative gain of the two signal paths and/or the relative time delay of the two signal paths so as to obtain a substantially flat transfer function for the summed signal. The same method can also be used to calibrate the overall gain and time delay of the phase noise detection and/or phase noise cancellation apparatus so as to obtain a targeted transfer function gain or transfer function time delay.

Another method of calibrating the relative gain and/or the relative time delay of the integrated and non-integrated signal paths, or to calibrate the overall gain or time delay of the phase noise detection and phase noise detection and/or phase noise cancellation apparatus is to measure the phase noise after the phase modulator at least partially removing the laser phase noise and to use this monitoring to adjust said gains or time delays so as to obtain optimum phase noise removal.

One of the advantages of the availability of the proportional signal path for high-speed operation is that it does not require an integrator even when a flatband transfer function is required, but only signal amplification and/or a phase modulator driver. The reduction in circuit complexity can allow for higher speed operation and reduced electrical power consumption.

A good technology platform to implement such a structure is given by silicon-on-insulator (SOI) based Silicon Photonics and integrated photodetectors compatible with silicon photonics technology, for example germanium photodetectors.

A whispering gallery resonator is a resonator such that an optical mode circulates along the circumference of the resonator and can be distinguished from a Fabry-Perot resonator in which light circulates two times through the same resonator section prior to completing a round-trip.

Most types of resonators are suitable to realize the system concepts described here. For integrated, chip scale solutions ring, disk, microtoroid, or other topological loops (i.e., a waveguide bent on itself, supporting whispering gallery modes) or whispering gallery resonators are particularly attractive due to their ease of integration. Frequency comb generation has been demonstrated in a variety of such resonators, such as dielectric etched ring or disk waveguides (e.g. $SiO_2$, doped $SiO_2$, silicon nitride, silicon oxinitride). Resonators with particularly high quality factors have been demonstrated with thermally reflown $SiO_2$, for example in the form of microtoroids (see D. K. Armani, T. J. Kippenberg, S. M. Spillane, K. K. Vahala, "Ultra-high-Q toroid microcavity on a chip", Nature 421, 925-928 (2003), hereby incorporated by reference above).

Even though phase noise is often referred to as laser phase noise in this disclosure, this only refers to the fact that this is phase noise of light that has at some point been generated by a laser. It does not imply that the phase noise itself was necessarily generated in the laser, and can also refer to phase noise that was generated elsewhere in the system, for example by a noisy phase modulator, by fluctuations of environmental conditions acting on fibers or waveguides or by other elements of the optical system.

System Applications and More Complex Architectures:

An important application for phase noise cleaning is the generation of frequency combs with high quality factor resonators, as multi-wavelength light sources or as tools for instrumentation. In order to optically pump such a resonator, the pump light has to fall within the linewidth of the resonator. A Q-factor of 100e6 in the near infra-red (1300 nm-1550 nm) corresponds to a linewidth of ~2 MHz. DFB can have linewidths of 1-2 MHz to up to a few 100 MHz. Since the width of the pump beam can be limited by phase noise, removing phase noise can help efficiently pumping the resonator. Frequency comb generation is also more efficient with a clean, low noise light source (even when falling within the linewidth of the resonator), and for all these applications, the noise of the generated frequency comb is of high importance.

In order to reduce device redundancy that leads to increased system complexity as well as to increased optical losses, it can be very attractive to use the same resonator to both generate the optical comb and to detect the phase noise.

Figure 5:
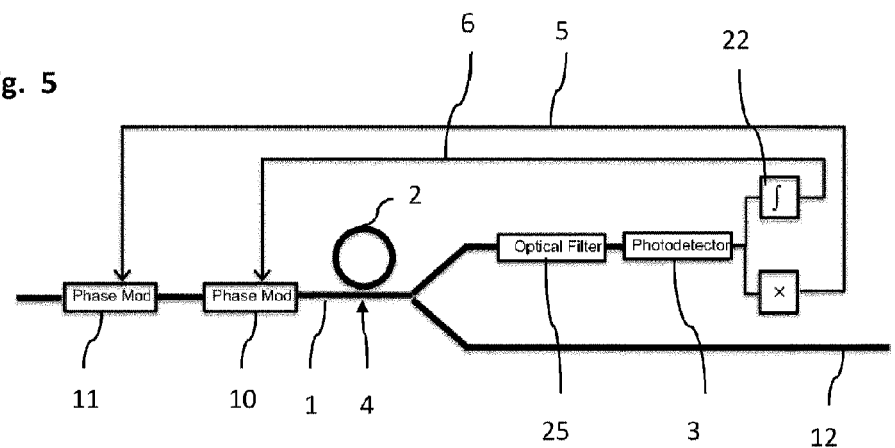
FIG. 5 shows a configuration allowing for phase noise cleaning together with nonlinear generation of other frequency components such as frequency combs in the optical resonator.

FIG. 5 shows such a system. While typically optical power is first tapped from the main optical path before being sent to the phase noise detection subsystem, in this case the resonator has to reside in the main optical path, since it has also an optical function for the downstream optical system (i.e., generating the comb). Some type of optical filtering between the output port of the loaded resonator and the photodetector can be desirable, since the recorded signal should reflect the phase noise of the laser pump and not amplitude noise of the generated comb frequency components. An optical filter can be optionally placed in the optical path between the resonator and the photodetector (belonging to the laser phase noise detection subsystem) as shown in FIG. 5. Another way is to make the optical splitter (shown as a waveguide branch in FIG. 5) wavelength selective, for example, by using an interleaver or a resonator in add-drop configuration. For example, a ring can be coupled to two waveguides, such that only the resonant frequencies are transferred from one waveguide to the other. By using a Vernier configuration relative to the frequency comb, it is possible to just (partially) transfer the pump frequency. Such a selective power tap also has the advantage of not wasting optical power from the other comb components that do not significantly contribute to the laser phase noise signal. Another way to achieve a frequency dependent tap could be to directly tap the main resonator (shown in FIG. 5) by coupling it to another resonator in Vernier configuration, such that only the pump frequency is partially extracted and sent to the photodetector.

It is desirable for the optical filter to have a passband that is less than the frequency spacing between two adjacent comb components, in order to let only the pump beam through. The passband however can be much more relaxed than the resonator linewidth, facilitating the implementation of the optical filter. In particular, in some cases the required frequency passband of the optical filter can be sufficiently relaxed (widened) such that it does not need to be actively controlled or trimmed after manufacturing. The filter can also have additional passbands without impacting system performance if they do not coincide with components of the frequency comb.

In a preferred embodiment, the optical filtering functionality is implemented with several ring or disk resonators (or other resonators supporting whispering gallery modes) that are directly or indirectly (for example via a waveguide) coupled to each other in a cascaded fashion. This allows to obtain passbands centered on the resonances of the rings, but with a flattened passband, and a passband width that is a function of the ring to ring coupling strength. As mentioned previously, a flattened and widened passband allows to relax fabrication tolerances for the filter, however the width of the passband should typically be small enough such that the next comb component does not fall within the passband. Typically, the free-spectral range of the resonators constituting the filter, and thus the free spectral range of the filter (the frequency difference between two passbands) should be such that the next passband falls outside of the extremes of the frequency comb. Another option is to use a Vernier effect by modifying the circumferences of the resonators constituting the filter relative to each other such that an isolated pass-band, or a wider spectral separation between passbands is obtained, but to maintain sufficiently high coupling strengths between resonators in order to obtain the desired passband width. Circumferences do not all need to be different from each other, as the number of resonators in the filter can exceed the number of different circumferences. For example two different circumferences can be introduced even if the number of resonators is larger, for example by alternating between the two circumferences in the resonator chain.

In the absence of an explicit filter, several comb components are sent to the photodiode. However, a low noise situation remains an attractor state of the system, i.e., if the pump beam is noiseless, the amplitude noise of the generated comb components will also be minimized and the feedback signal minimized. Hence, if stability criteria are verified the loop can still reduce the phase noise of the laser pump and of the overall system.

The photodetector used to measure the phase noise can also be used to obtain a control signal used to align the laser frequency to the resonant frequency of the resonator or to maintain a fixed frequency offset (in order to obtain a good frequency noise detection transfer function it is typically desirable to maintain a small frequency offset, for example on the order of half the resonator linewidth).

In order to minimize contributions from frequency comb components other than the pump beam, a low pass filter with a bandwidth smaller than the frequency offset between two adjacent comb components can be added into the phase removal signal path. On the other hand, in order to obtain stable frequency comb spacing, specifically if this spacing is larger than the free spectral range of the resonator (i.e., and integer time the free spectral range where the integer is larger than 1), a beating note corresponding to the spacing between to adjacent comb components can be recorded and applied as a modulation signal in a phase modulator placed upstream from resonator. For example, a phase modulator can be used both as a means to obtain stable frequency comb spacing a well as pump beam phase noise removal. In order to send both the phase noise cancelation signal as well as a feedback signal used to lock the frequency comb spacing back to the phase modulator, the optical filter can have a second wavelength notch offset from the pump beam by one desired frequency comb spacing (or two optical path with distinct filters can be sent to the same, or to separate photodetectors that are later summed). Finally, in order to initialize, seed or stabilize the frequency comb generation with the desired frequency comb spacing during the ramp-up phase or during continuous operation, an electrical signal with the corresponding desired beating note can be independently generated and added to the phase modulator while the laser power is ramped up, or until the desired frequency comb spacing has been achieved and stabilized, or permanently added during continuous operation.

In general, a beating note can be recorded from the frequency comb and sent to a phase or amplitude modulator in the optical path prior to a resonator generating a frequency comb in order to stabilize the frequency comb.

The resonator used to monitor phase noise can also be distinct from the resonator used to generate the frequency comb, in which case difficulties relating to intensity noise of the generated frequency comb components interfering with the pump beam phase noise detection can be avoided.

In a system where phase noise cancellation is applied at an optical transmitter with phase encoding in order to reduce phase noise, the data can be summed with the phase noise cancellation signal prior to being applied to a phase modulator, such that a single phase modulator applies both data and phase cancelation to the optical path.

In the systems described in this disclosure, runoff of the integrated signal path due to very low frequency components, including a DC signal component, might have to be actively prevented, for example with an offset cancelation, or by making the integrator dissipative for very low frequency components (here very low frequency components is used to distinguish from low frequency components, since the latter terminology simply refers to frequency components lying inside the resonator linewidth, for which the integrator was added in the first place). Very low frequency drifts can be compensated for by other systems, such as a laser frequency control system, a resonance frequency control system, or an optical phase locked loop.

The resonator based laser phase noise detection schemes described in this document can also be embedded in more complex optics, for example one of the arms of an interferometer can be loaded (coupled to) with a resonator. For phase noise lying within the linewidth of the resonator, the resonator acts essentially as a delay line and applies a time delay to the light traveling through the coupled waveguide. The conversion of slowly varying phase changes into amplitude variations are further amplified at the output coupler of the interferometer. For phase noise outside of the bandwidth of the resonator, the resonator applies instantaneous phase and amplitude shifts to the light that change the interference pattern at the output coupler of the interferometer. The basic difference between noise falling inside and outside the linewidth of the resonator, in that in one case a derivation operator is applied and in the other not, remains true. The final signal picked up by the photodiodes can be sent to similar electronic signal processing. In particular two signals can be generated, one corresponding to integration and optionally rescaling of the photodetector signal and the other simply to optionally rescaling. This remains true for any larger photonic system in which the resonator is embedded since it is a fundamental property of the response of the resonator to laser phase noise.

The phase noise detection schemes described here can also be used at the receive end of a communication system where phase information carries information (such as phase encoded communication systems). This is particularly attractive for technology platforms where the realization of conventional delay lines is difficult. This is, for example, the case in Silicon Photonics, since controlling the phase delay of a long enough silicon delay line to delay the light by one bit (on the order of 1 cm at 10 Gbps) is very problematic.

In FIG. 1, a waveguide 1 is coupled to a resonator 2 and routed to a photodetector 3. The phase noise of light transported by the waveguide prior to the coupling point 4 is converted into intensity noise of light transported by the waveguide after (behind) the coupling point 4. The photodetector converts the intensity noise generated according to the phase noise into an electrical signal sent through a first signal path 5 and a second signal path 6 such that the first signal path transports a signal substantially proportional to the intensity noise and such that a signal substantially proportional to the intensity noise is integrated in an integrator 22 in the second signal path. The relative gain of the two signal paths can be adjusted, for example with adjustable signal amplifiers 7 and 8. Since the integrated signal path only carries a relevant signal for noise frequencies inside the linewidth of the resonator, a low pass filter 9 can be added to the integrated signal path in order to filter out electronic noise or shot noise that is not according to the phase noise of the light, for example with a low pass filter with a bandwidth on the order of the full width at half maximum of the resonator. In the embodiment depicted in FIG. 1(b), a control system is present that is adapted to align the laser center frequency with the resonator resonance. In the embodiment depicted in FIG. 1(c), additional waveguide combiners are present on the optical path.

FIG. 2, left, is a graphical representations of a phase noise to intensity noise transfer function of the proportional and integrated signal paths in arbitrary units. The proportional signal path has a constant transfer function for phase noise with a higher frequency than the linewidth of the resonator. The integrated signal path has a high transfer function for phase noise frequencies lying within the linewidth of the resonator. If the relative weight of the two signal paths is adjusted, the sum of the transfer functions of the two signal paths is constant, so that a frequency insensitive transfer function can be achieved.

FIG. 2, right, is a simulated laser spectra before and after phase cleaning. The top curve (noisiest curve) corresponds to the initial laser spectrum. The second curve to the laser spectrum after phase noise cleaning when only using a proportional signal path and adjusting the gain of the proportional signal path to obtain optimum phase noise cleaning. The phase noise is reduced for phase noise lying outside of the bandwidth of the resonator, but the phase noise is only marginally reduced for low frequency phase noise components lying inside the linewidth of the resonator. The lowest curve corresponds to a phase noise removal scheme utilizing both a proportional signal path and an integrated signal path that allows removing phase noise for frequencies lying both within and outside of the linewidth of the resonator.

In FIG. 3, several embodiments of the phase noise removal scheme are shown. In the first (topmost) embodiment (a), the phase noise is removed with a feedback loop and the proportional and integrated signal paths are added in the optical domain by cascading two phase modulators such that a waveguide passes through both of the modulators. A phase modulator 10 is driven by the signal from the integrated signal path while a phase modulator 11 is driven by the signal from the proportional signal path. The phase noise is a least partially cancelled in the waveguide 12.

In the second embodiment (b) (second from top), the proportional and the integrated signal path are summed in the electrical domain with a summing circuit 13. The resulting signal drives the phase modulator 10 so as to cancel the phase noise in the waveguide 12.

In the third embodiment (c), the phase noise is canceled with a feedforward scheme. The proportional and the integrated signals are applied to the modulators 11 and 10 so as to cancel the phase noise in the waveguide 16. A delay line 15 is used to match the time delay for light propagating through the waveguide 18 between the waveguide splitter 17 and the phase modulators 10 and 11 to the time delay for light propagating between the splitter 17 and the photodetector 3 added to the time delay of the electrical signal paths 5 and 6.

The fourth embodiment (d) is a scheme that cancels phase noise in the waveguide 16 with a combination of a feedforward scheme and a feedback scheme, wherein the integrated signal 6 is applied to a feedback scheme and the proportional signal 5 passes optionally through a high pass filter 20 and is applied to a feedforward scheme.

FIG. 4 illustrates a phase noise cancellation scheme where the relative weight (signal strength) of the proportional signal path 5 and the integral signal path 6 is adjusted with a control loop that compares the signal strength of the integrated signal path with the proportional signal path. In a preferred embodiment, both signal paths are tapped or duplicated and sent through notch filters 19 that select a predetermined noise frequency range for which the required relative weight of the signal paths is known. They are then optionally averaged. A comparator 21 checks whether the actual relative signal weight is above or below the required relative signal weight, thus generating a control signal 23 that is optionally integrated by an integrator 22 and applied to an adaptive signal amplifier 24.

FIG. 5 illustrates a phase noise cancellation scheme compatible with the generation of other frequency components via nonlinear processes in the resonator 2. An optical filter 25 filters out a single frequency component, typically the frequency component corresponding to the light transported in waveguide 1 prior to the coupling point 4, such that the resulting photodetected light in photodetector 3 is according to the phase noise of the light transported in waveguide 1 without a convolution of the phase noise of multiple frequency components.

What is claimed is:

1. A phase noise detection apparatus comprising:
at least one laser beam, an optical resonator coupled to the at least one laser beam at a coupling point, and a photodetector arranged to receive light from the laser beam, wherein
the at least one laser beam and the resonator coupled thereto convert phase noise of light transported by the at least one laser beam prior to the coupling point into intensity noise of light transported by the at least one laser beam after the coupling point, wherein the intensity noise after the coupling point is generated as a function of the phase noise prior to the coupling point, and
said photodetector is adapted to convert the intensity noise into an electrical signal; and
at least one electrical signal path and at least one optical phase modulator, wherein
the at least one electrical signal path is adapted to apply the electrical signal to the at least one optical phase modulator, and
the at least one electrical signal path includes first and second electrical signal paths adapted for the electrical signal to be sent thereto, to the first electrical signal path with a signal substantially proportional to the intensity noise, and to the second electrical signal path where a signal substantially proportional to the intensity noise is integrated, wherein the first and the second electrical signal paths are connected to the at least one phase modulator compensating phase noise in an optical domain, and said at least one phase modulator is (i) one out of several optical phase modulators or (ii) a unique optical phase modulator wherein both electrical signal paths are combined in an electrical domain prior to being applied to said unique optical modulator.

2. An apparatus as defined in claim 1, configured such that the phase noise is converted to intensity noise with a conversion efficiency that is substantially independent of phase noise frequency when said phase noise frequency is outside a linewidth of the resonator, and further configured such that phase noise with a frequency outside of the linewidth of the resonator is first converted into intensity noise, then converted into an electrical signal by the photodetector and thereafter applied to an optical phase modulator that at least partially cancels said phase noise with a frequency outside the linewidth of the resonator in an optical domain.

3. An apparatus as defined in claim 1, wherein the resonator is one of (i) a whispering gallery resonator, (ii) a disk resonator or (iii) a microtoroid resonator.

4. An apparatus as defined in claim 3, wherein the resonator is a ring resonator.

5. An apparatus as defined in claim 1, wherein the photodetector comprises a Germanium waveguide photodetector in which the light is at least partially absorbed by the Germanium and wherein the apparatus includes silicon on insulator material.

6. An apparatus as defined in claim 1, configured such that the first and second electrical signal paths are combined in the optical domain by applying them to separate of said several optical phase modulators optically connected such that light passes through said separate modulators and the combined signal is the sum of phase modulations applied to said light, wherein the first and second signals are combined with relative weights such that a resulting signal is modulated according to the phase noise of the light with a transfer function that is substantially constant for phase noise both inside and outside of the linewidth of the resonator for frequencies that are within passbands of the photodetector and of electronic circuits of the first and second signal paths.

7. An apparatus as defined in claim 6 wherein the transfer function is a flatband within 30% of a maximum of the transfer function for a phase noise frequency range spanning from ⅛ to ¾ of the full width at half maximum of the resonator linewidth.

8. An apparatus as defined in claim 6, wherein (i) the first electrical signal path and the second electrical signal path are combined with a relative summation weight, or (ii) a relative signal strength of the first and second electrical signal paths is adjusted with a summation weight prior to summation, wherein the summation weight is determined according to at least one of (i) quality factors of the resonator, (ii) a loaded quality factor of the resonator, (iii) a coupling strength between the waveguide and the resonator, (iv) relative signal strengths of the first and second electrical signal paths, (v) relative signal strengths of the first and second electrical signal paths measured for an artificially induced phase noise with a well-defined frequency or well-defined frequency range, (vi) relative signal strengths of the first and second electrical signal paths measured after filtering the first and second electrical signal paths with a notch filter, and (vii) residual phase noise, measured by an additional apparatus, of light having passed through at least one optical phase modulator driven by a signal generated according to the intensity noise.

9. An apparatus as defined in claim 1, wherein the at least one electrical signal path is further adapted to produce an overall gain such that the optical phase modulator is adapted to at least partially cancel said phase noise in an optical domain.

10. An apparatus as defined in claim 1, further comprising a waveguide adapted to guide the at least one laser beam therein.

11. An apparatus as defined in claim 10, further comprising a control system adapted to adjust at least one of a resonance frequency of the resonator and a center frequency of the light in the waveguide such that the center frequency falls within a predetermined region of the linewidth of the resonator.

12. An apparatus as defined in claim 11, wherein the photodetector is adapted to record the intensity noise and generates a control signal used to adjust at least one of the resonance frequency of the resonator and the center frequency of the light in the waveguide.

13. An apparatus as defined in claim 10, wherein the resonator is coupled to the waveguide, which are adapted to convert said phase noise to said intensity noise, and further includes one of (i) no additional optical elements, (ii) optical elements coupling the waveguide to the optical resonator, or (iii) optical elements adapted to adjust a resonance of the resonator and a center frequency of the light transported by the waveguide to one another with a control system.

14. An apparatus as defined in claim 13, further comprising an offset between a center frequency of the light and a resonant frequency of the resonator such that transmission through the waveguide and coupled resonator is between 20% and 80%, where 0% corresponds to a minimum transmission corresponding to where the center frequency of the light is equal to the resonant frequency of the resonator, and 100% corresponds to a transmission when the center frequency of the light is detuned from the resonant frequency by two full width at half maximum of the resonant frequency.

15. An apparatus as defined in claim 14, wherein the resonant frequency of the resonator lies within plus or minus thirty percent of the full width at half maximum of the resonance linewidth from a frequency detuned from the laser beam frequency by one of plus or minus one half of the full width at half maximum of the resonance linewidth.

16. An apparatus as defined in claim 10, configured so that at least a portion of the light transported by the waveguide is coupled to the resonator and at least a portion of the light transported by the waveguide is not coupled to the resonator, wherein at least a portion of the light coupled to the resonator is coupled back to the waveguide and interferes with the portion of the light not coupled to the resonator, resulting in the intensity noise, wherein the portion of the light coupled to the resonator and coupled back to the waveguide substantially corresponds to a time averaged version of the light transported in the waveguide such that phase noise components with a frequency outside of a linewidth of the resonator are substantially averaged out, wherein the interference between the time averaged portion of the light corresponding to the portion of the light coupled to the resonator and coupled back to the waveguide and the non-time averaged portion of the light corresponding to the portion of the light not coupled to the resonator results in a conversion of phase noise into intensity noise with a conversion efficiency that is substantially independent of the phase noise frequency for phase noise frequencies outside of the linewidth of the resonator, and further configured to apply the electrical signal to an optical phase modulator so as to at least partially cancel said phase noise in an optical domain.

17. An apparatus as defined in claim 10, wherein the waveguide is coupled to the resonator and one of (i) operatively connects directly to the photodetector after the coupling point with the resonator without being routed through waveguide combiners not coupling the waveguide to the resonator, (ii) operatively connects to the photodetector via additional waveguide combiners not coupling the waveguide to the resonator such that additional optical power added by the additional waveguide combiners to optical power routed from the resonator coupling point to the photodetector is less than 30% of said optical power.

* * * * *